(12) United States Patent
van Lieshout et al.

(10) Patent No.: US 8,488,328 B2
(45) Date of Patent: Jul. 16, 2013

(54) ELECTRONIC DEVICE COMPRISING A FLEXIBLE AREA WITH A SPECIFIC BENDING REGION

(75) Inventors: Petrus Johannes Gerardus van Lieshout, Beek en Donk (NL); Hendrik Dirk Visser, Eindhoven (NL); Michael Johannes Anna Maria Walters, Eindhoven (NL); Gijs Peters, Eindhoven (NL)

(73) Assignee: Creator Technology B.V., Breda (NL)

( * ) Notice: Subject to any disclaimer, the term of this patent is extended or adjusted under 35 U.S.C. 154(b) by 256 days.

(21) Appl. No.: 12/747,426

(22) PCT Filed: Dec. 10, 2008

(86) PCT No.: PCT/NL2008/050788
§ 371 (c)(1),
(2), (4) Date: Nov. 16, 2010

(87) PCT Pub. No.: WO2009/075574
PCT Pub. Date: Jun. 18, 2009

(65) Prior Publication Data
US 2011/0122593 A1 May 26, 2011

Related U.S. Application Data

(60) Provisional application No. 61/012,694, filed on Dec. 10, 2007.

(51) Int. Cl.
*H05K 7/00* (2006.01)
*G02F 1/1333* (2006.01)
(52) U.S. Cl.
CPC .............................. *G02F 1/133305* (2013.01)
USPC .......................................... 361/760; 174/255

(58) Field of Classification Search
CPC .... G02F 1/133305; G02F 2001/133302; H05K 1/189; H05K 3/0058
USPC ................. 174/255, 260, 261; 361/748, 749, 361/760–764, 807; 439/68, 82, 83; 156/334, 156/292
See application file for complete search history.

(56) References Cited

U.S. PATENT DOCUMENTS

| | | | | |
|---|---|---|---|---|
| 6,024,580 A | * | 2/2000 | Dangler et al. | 439/67 |
| 6,323,832 B1 | * | 11/2001 | Nishizawa et al. | 345/83 |
| 8,222,810 B2 | * | 7/2012 | Yan et al. | 313/511 |
| 2003/0072153 A1 | | 4/2003 | Matsui et al. | |
| 2004/0112632 A1 | * | 6/2004 | Michiwaki et al. | 174/254 |
| 2004/0124763 A1 | * | 7/2004 | Nathan et al. | 313/498 |

FOREIGN PATENT DOCUMENTS

| | | |
|---|---|---|
| WO | WO 02/067329 A | 8/2002 |
| WO | WO 2006/129232 A | 12/2006 |

OTHER PUBLICATIONS

International Search Report for PCT/NL2008/050788 dated Mar. 17, 2009.

\* cited by examiner

*Primary Examiner* — Yuriy Semenenko

(57) ABSTRACT

The invention relates to an arrangement 10 comprising a flexible carrier 6 having a front surface and a back surface; a component 2 adhered to the front surface of the flexible carrier, and a stiffener 8 extending at least partially over said front surface or said back surface for protecting at least a portion of the front surface or the back surface of the flexible carrier 6, wherein the stiffener 8 comprises a first region 8c extending over an area covered by the component 2 and a second region 8a, 8b extending over an area not covered by the component 2, the second region being more flexible than the first region.

14 Claims, 6 Drawing Sheets

ELECTRONIC DEVICE COMPRISING A FLEXIBLE AREA WITH A SPECIFIC BENDING REGION

FIELD OF THE INVENTION

The invention relates to an electronic device comprising a rigid element adhered to a flexible substrate. More particularly the invention relates to an electronic device comprising:
a flexible carrier having a front surface and a back surface;
an electronic component adhered to the front surface of the flexible carrier, and
a stiffener extending at least partially over said front surface or said back surface for protecting at least a portion of the front surface or the back surface of the flexible carrier.

BACKGROUND OF THE INVENTION

An embodiment of an arrangement as is set forth in the opening paragraph is known from WO 2006/061786A1. Document WO 2006/061786A1 describes a flexible display comprising an assembly of a flexible carrier, for example a backplane substrate arranged with an array of pixel electrodes and conductors to drive electronics and a frontplane comprising rigid components, for example electro-optic cells of the display and integrated circuits. The frontplane electronics is usually adhered to the backplane substrate by using a suitable adhesive means. Another embodiment of the electronic device as is set forth in the opening paragraph relate to flexible touch pads, flexible keyboards, flexible printed-circuit boards, etc. Also in these devices substantially rigid electronic components may be adhered to a flexible substrate for forming the device.

It is acknowledged that such arrangements are very sensitive to mechanical stress. For example, portions wherein connections between the electronic components and the flexible carrier can easily be damaged. This damage can range from scratches to buckling due to undesired deformations of the flexible carrier, for example a relatively thin foil. Usually, vulnerable areas are protected by a stiffener.

SUMMARY OF THE INVENTION

It is a disadvantage of the known arrangement that rigid elements, notably electronic components, lose contact with the flexible carrier, notably a backplane substrate of the flexible display, as a consequence of bending. Frequent bending presents a severe risk of de-adhesion. This results in reduced endurance of the known arrangement.

It is an object of the invention to provide an arrangement with increased durability due to improved resistance against mechanical stress under bending condition.

To this end, in the arrangement according to the invention the stiffener comprises a first region extending over an area covered by the component and a second region extending over an area not covered by the component, the second region being more flexible than the first region.

It will be appreciated that the arrangement comprising a stiffener, a flexible carrier and the component is three-dimensional. The term "extending over an area" may refer to a geometry where the stiffener is arranged on the back surface of the flexible carrier so that the area covered by the component three-dimensionally projects on the first region. It is, therefore, not necessary to arrange the first region in direct contact with the component. In accordance with the technical measure of the invention a stiffener may be provided for the flexible carrier, said stiffener having a first region which is substantially rigid and a second region, which is substantially bendable. As a result, the flexible carrier is provided with a preferred bending region whereat bending occurs under application of smaller forces, compared to forces required to bend the first region. This preferred bending area substantially corresponds to the second region of the stiffener. By arranging the second region outside the area covered by the component, this area does not undergo any substantial bending during handling of the flexible carrier. This effectively reduces damage to the arrangement which is caused by de-adhesion of the component from the flexible carrier. Preferably, the second region is arranged in a direct vicinity of the component. Alternatively, the second region may be arranged distant from the component. More preferably, the component is surrounded by a plurality of second regions in a direction of possible bending. It is also possible that the component is substantially completely surrounded by the second region. Due to any of these features a dimension of the first region can be small which decreases a risk of undesired deformation in this region.

In an embodiment of the arrangement according to the invention, the second portion may be arranged substantially at an envisaged bending area of said stiffener. Preferably, the stiffener is arranged with sufficient thickness to provide rigidity to the flexible carrier, yet allowing it to bend. By adding mechanically weaker regions to the relatively thick stiffener, bending can be purposefully directed to specific areas and can substantially be conformed to these areas. By arranging the second regions at specific places a bending behavior of the flexible carrier can be controlled.

A thickness of the stiffener used to protect the component can be smaller in the second region than a thickness of said stiffener in the first region. For example, the second region may comprise a gap or a blind gap. The blind gap may refer, for example, to a suitably shaped cavity in a material of the stiffener. Alternatively, the second region may have a smaller dimension in a plane of the stiffener than the first region.

It is found to be advantageous to provide the stiffener with different materials, a first material being substantially more rigid than the second material. In accordance with the invention, the first material is arranged at the first region and the second material is arranged at the second region.

In a particular embodiment of the arrangement according to the invention, the arrangement comprises a portion of an electronic device such as, for example, a portion of a flexible display. In this case the component may correspond to an electronic module of the flexible display such as, for example, a bonding area of the flexible display or a pixel area of the flexible display. The bonding area may be arranged for enabling electrical connectivity to an array of electronic pixels of the flexible display and/or to the array of pixel electronics, notably IC chips or electro-optic elements. It is found to be preferable to provide the stiffener as a one-piece component which has an additional advantage that a suitable handling of the display may be enabled by grabbing the area of the stiffener. Alternatively, the stiffener may be arranged as a plurality of islands arranged at respective areas covered by electronic components. It is noted that such island structure may also be referred to as a stiffener having a first region and the second region. The second region in this case relates to areas where voids are present.

These and other aspects of the invention will be further discussed with reference to figures.

DETAILED DESCRIPTION OF THE DRAWINGS

Figure 1A:
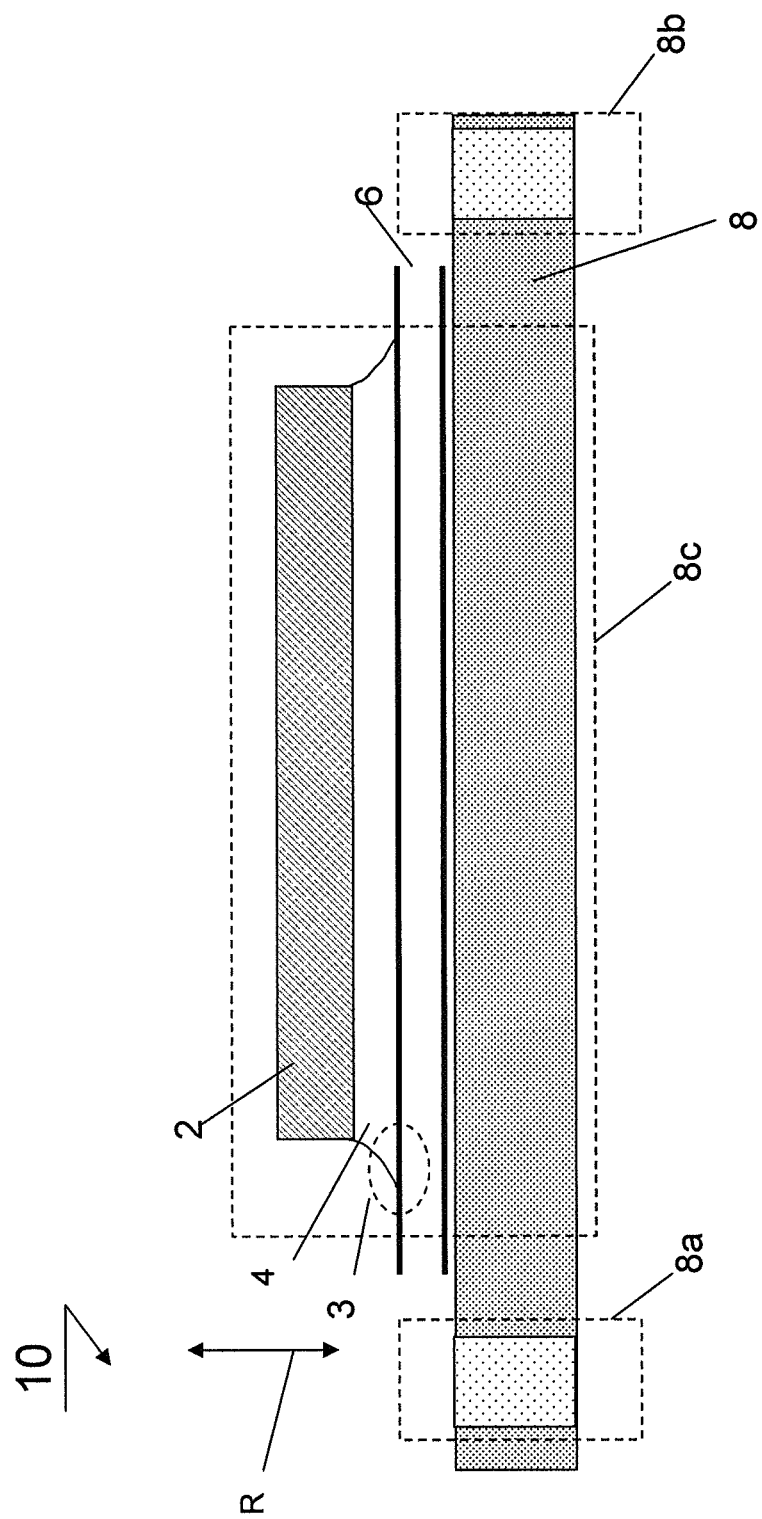
FIG. 1a presents a schematic view of an embodiment of an arrangement according to the invention.

FIG. 1a presents a schematic view of an embodiment of an arrangement according to the invention. The arrangement 10, for example a touch pad, a flexible keyboard, a flexible printed circuit, a flexible display, or the like, comprises a rigid component 2, for example an integrated circuit structure, adhered to a flexible carrier 6 by means of a suitable adhesive 4. For example, the rigid element 2 may be laminated on the flexible carrier 6 by means of suitable glue 4. It has been understood that the endurance of a mechanical structure comprising a rigid component adhered to a flexible carrier or of an electronic device comprising a rigid electronic component adhered on a flexible carrier reduces to a substantial extent when adhesion between the rigid element 2 and the flexible carrier 6 is damaged in the area 3 due to bending, in particular, due to repetitive bending in a direction, schematically indicated by arrow R.

In accordance with the invention, in order to counteract this problem, the flexible carrier 6 is provided on a stiffener 8 arranged with a rigid portion 8c positioned in an area substantially corresponding to the area of the rigid element 2 and second regions 8a, 8b arranged away from the area of the rigid element 2. The second region 8a, 8b is arranged to be mechanically weaker than the first region 8c. This may be realized by using a thinner layer of material in the regions 8a, 8b, compared to the region 8c. Alternatively, for the second regions 8a, 8b a different material may be selected than for the first region 8c. Preferably, such different material is more elastic than the material used for the first region 8c. Suitable materials for the respective regions are, for example different types of rubbers, PDMS. For the first region 8c, preferably, PET, PI materials may be selected, or glass.

Figure 1B:
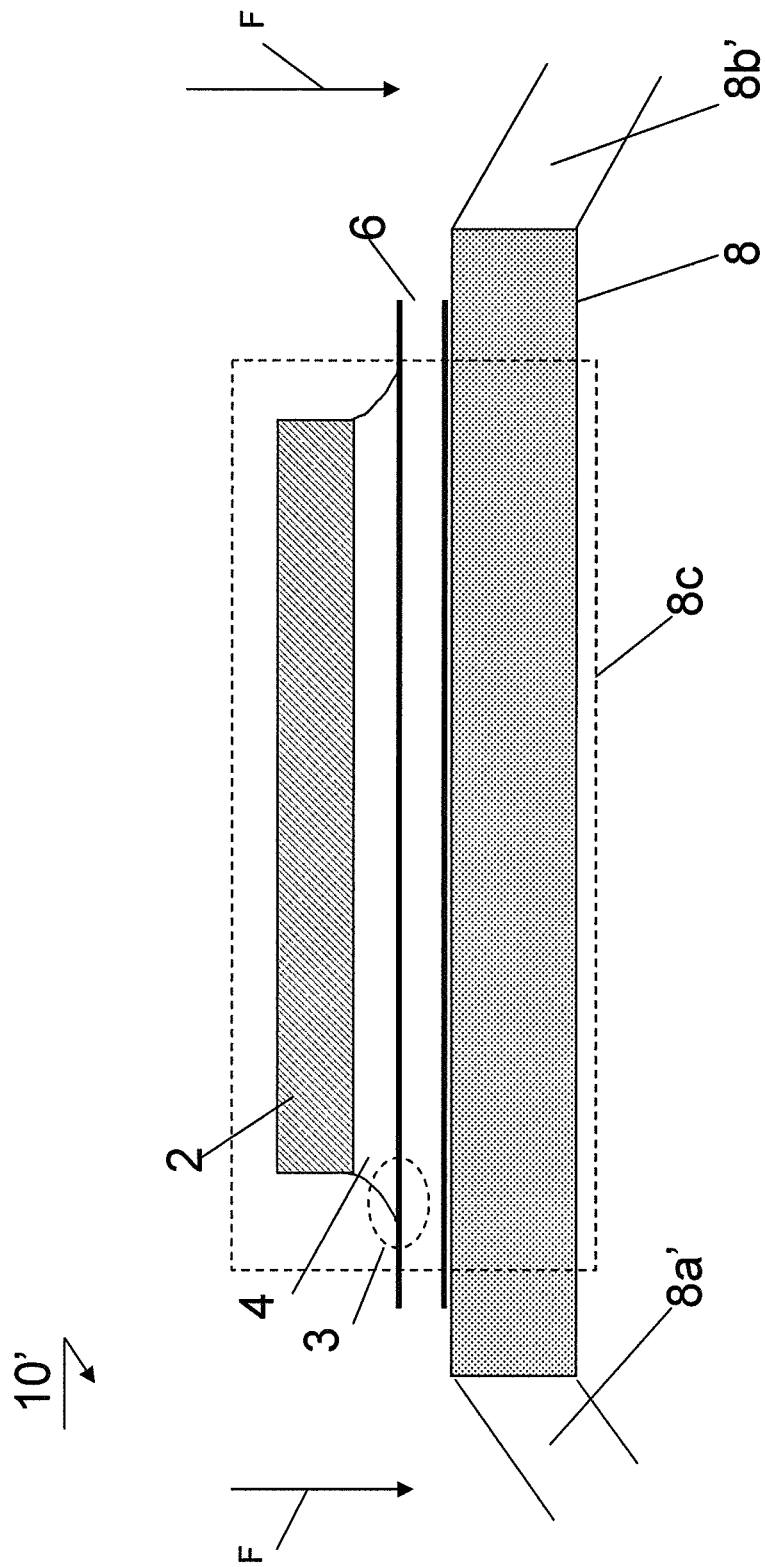
FIG. 1b presents a schematic view of the embodiment of FIG. 1a wherein a flexible carrier is bent.

FIG. 1b presents a schematic view of the embodiment of FIG. 1a wherein a flexible carrier is bent. FIG. 1b illustrates an effect of the technical measure of the invention. Under conditions of applied external force F, the flexible carrier 6 together with the stiffener 8 is bent in the regions corresponding to the weaker material 8a', 8b'. In this way a deformation behavior of the flexible carrier 6 is controlled, whereby its bending is conformed to regions 8a', 8b', located outside an area of the rigid element 2. Due to this feature the adhesion in the region 3 is not damaged, thus improving the endurance of the arrangement 10' according to the invention, notably of a suitable electronic device 10'.

Figure 2:
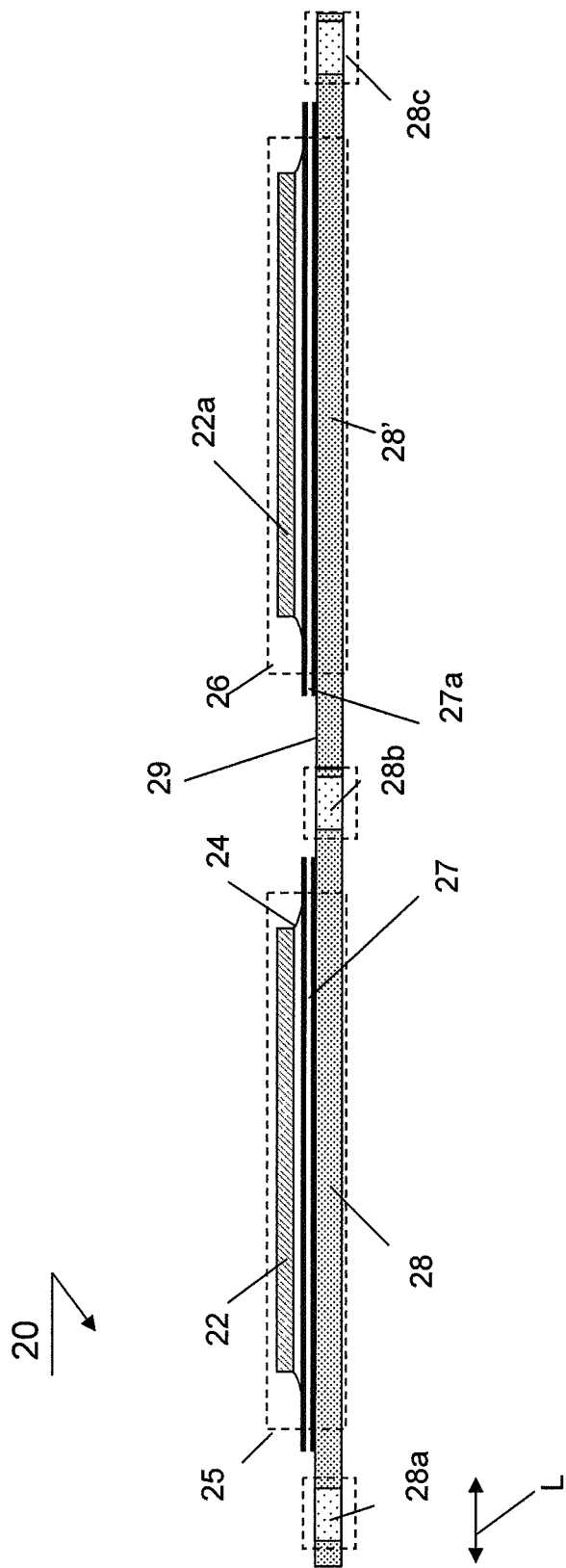
FIG. 2 presents a schematic view of a further embodiment of the arrangement according to the invention.

FIG. 2 presents a schematic view of a further embodiment of the arrangement according to the invention. This embodiment will be discussed with reference to an electronic device. The electronic device 20 may comprise a plurality of rigid components 25, 26, each comprising a rigid structure 22, 22a, such as, for example, an integrated circuit or another electronic component, adhered on a flexible carrier, respective portions of which being indicated by 27, 27a. The flexible carrier 27, for example a foil, is arranged on a stiffener 29 for protecting the rigid structure 22, 22a from mechanical damage. The stiffener 29 comprises first regions 28, 28' of a relatively stiff material, and second regions 28a, 28b, 28c of a relatively mechanically weak material. Because the second regions are arranged at respective areas outside the electronic elements 25, 26, the adhesion 24 of the electronic elements to the flexible carrier at respective regions 27, 27a is not affected during bending, because deformation is confined to areas 28a, 28b, 28c located away from respective areas of the electronic components 25, 26. It is noted that respective dimensions of the regions 28a, 28b, 28c depend on allowable bending radius, a smaller dimension leading to a sharper bending radius. It has been found that it is advantageous to provide the second region with a lateral dimension (in a direction L) not less than 1 mm. Preferably, a dimension of the second region is in a range of 5 mm. This ensures that the stiffener 28 can be bent to allow suitable handling of the electronic device such as, for example, allowing rolling or wrapping of a flexible electronic display on one hand, whereby no damage to the flexible carrier 27 is caused due to possible sharp bending radii.

Figure 3:
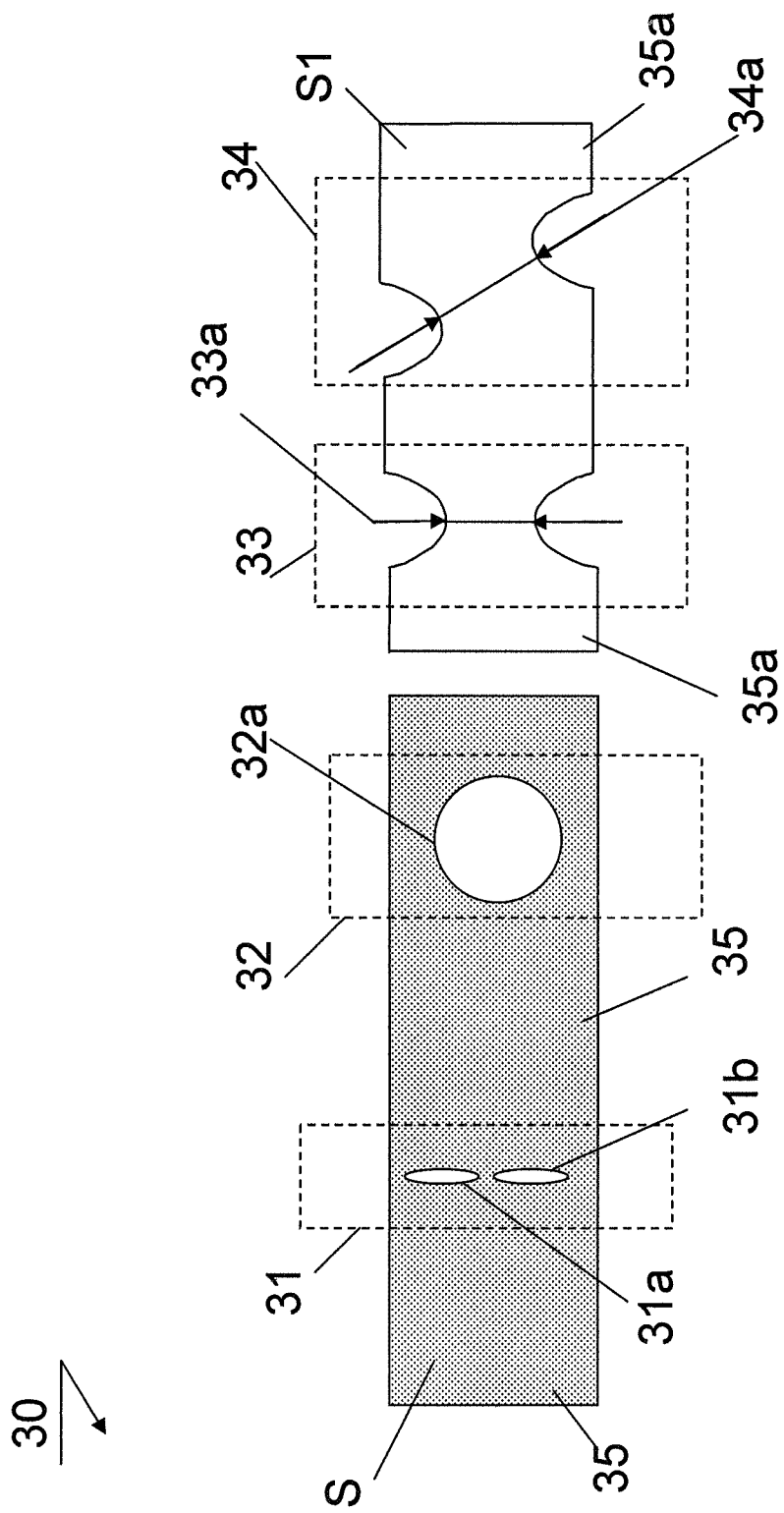
FIG. 3 presents a schematic view of embodiments of a segmented stiffener.

FIG. 3 presents a schematic view of specific embodiments 30 of a segmented stiffener. The segmented stiffener S may comprise a substantially rigid first region 35 and a substantially flexible second region 31, implemented as a suitable number of perforations 31a, 31b. It is also possible that instead of perforations 31a, 31b a suitable number of blind gaps is used. In an alternative embodiment one a more voids 32a may be arranged in the second region 32. In a further embodiment of the segmented stiffener a dimension of the second region 33a, 34a in a plane of the stiffener S1 is smaller than a dimension of the first region 35a in said plane. It is noted that such embodiment is preferably realized by providing suitable cut-aways 33a, 34a, which may be arranged substantially on the same lateral position along the stiffener S1, see 33, or at different lateral positions along the stiffener S1, see 34. It will be appreciated that specific embodiments as illustrated with reference to FIG. 3 may be replaced by equivalent arrangements providing a first, substantially stiff region and a second, substantially deformable region on the stiffener S, S1. Those skilled in the art will appreciate, therefore, that various modifications of the embodiments discussed with reference to FIG. 3 may be provided without departing from the scope of the invention.

Figure 4:
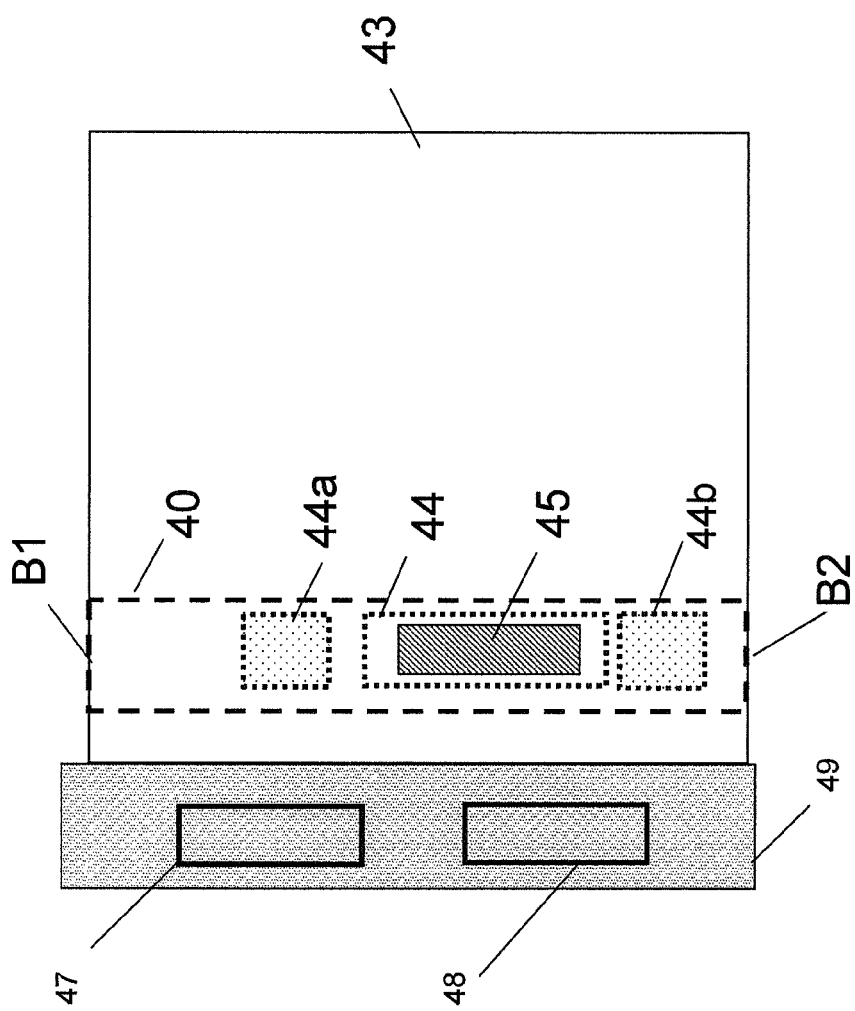
FIG. 4 presents a schematic view of an embodiment of a bonding area of a flexible display.

FIG. 4 presents a schematic view of an embodiment of a bonding area of a flexible display 43. The electronics preferably relates to a bonding area 40 which is used to connect suitable electronics of the display, like the display matrix, to other electronic equipment of a display-based device, like a power source 47, a processor 48, etc, which are located in a housing 49 of a suitable display-based electronic apparatus. Preferably, at least the bonding area 40 is provided with a stiffener comprising the first substantially rigid region 44 and a second region 44a, 44b, which is substantially flexible for enabling the stiffener to bend at the regions 44a, 44b, leaving the region 44 substantially non-deformed. Several embodiments of the segmented stiffener as discussed with reference to the FIGS. 1-3 may be used. As a result the bonding area 40 is protected against bending. In particular, the stiffener may be arranged as a one-piece structure, which enables a user to suitably handle the flexible display 43 by grabbing the stiffener at the regions B1, B2. The stiffener may be arranged at a backplane of the flexible device 43. It is also possible that the stiffener is arranged also at a front surface of the flexible display covering the bonding area 40. In this case the stiffener may be provided with suitable recesses to accommodate electronic components of the bonding area, schematically indicated by item 45. In this way the stiffener prevents the most sensitive regions from bending while offering an in-plane stiffness of the display when it is grabbed in regions B1, B2.

Figure 5:
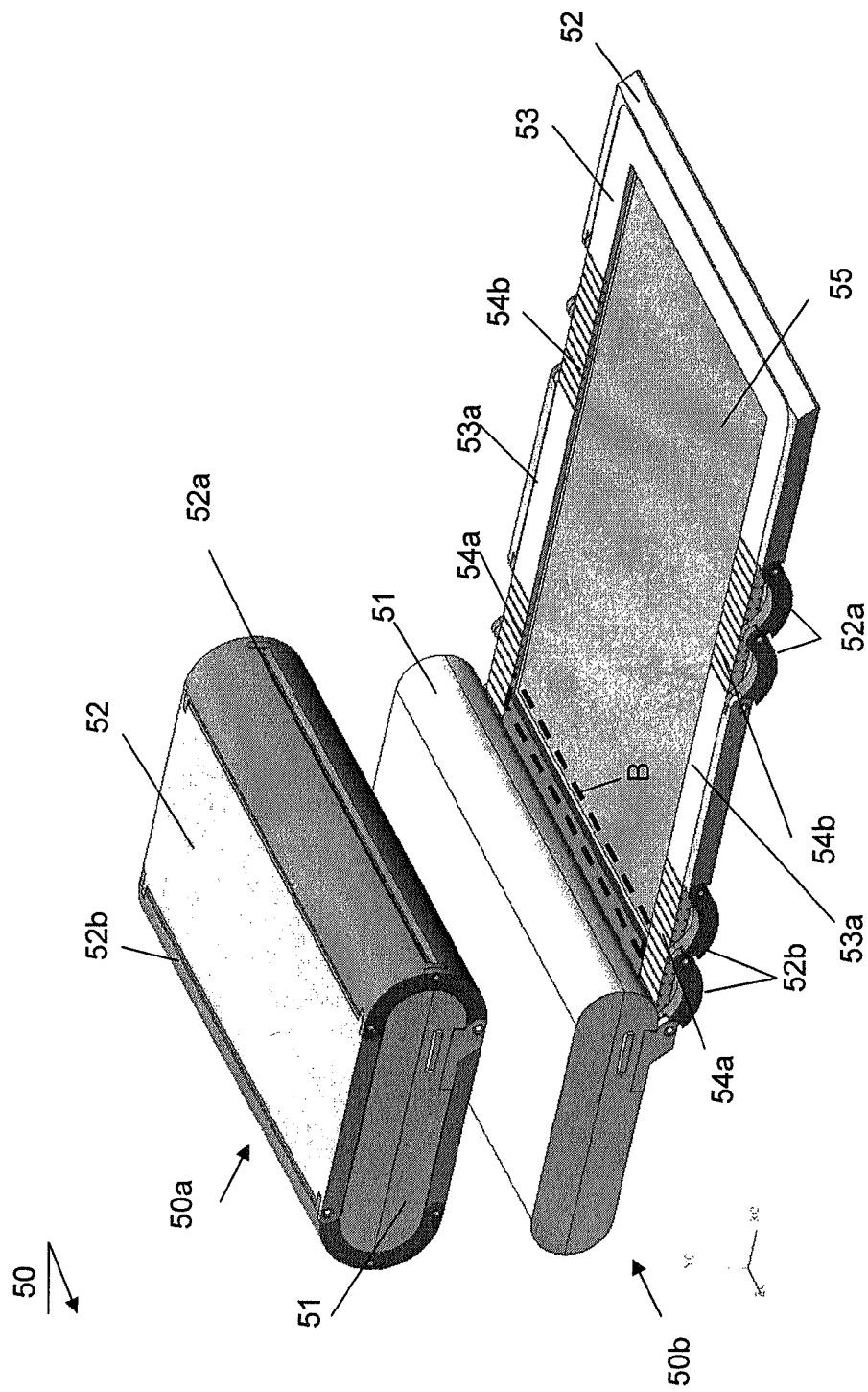
FIG. 5 presents a schematic view of an embodiment of an electronic device comprising a flexible display.

FIG. 5 presents a schematic view of an embodiment of an electronic device comprising a flexible display. The electronic device 50 comprises a housing 51 about which a flexible display 55 may be wrapped. The housing 51 may comprise a substantially rigid cover 52 arranged to receive the flexible display 55 and may be collapsed or extended together with it. The flexible display 55 may comprise active matrix electronics as discussed with reference to FIG. 4. The electronic device 50a, 50b may be implemented as a palmtop computer, a mobile phone, or the like. It is noted that other embodiments of the electronic device, like a computer monitor, electronic display screen or the like are contemplated as well. The cover 52 may comprise hinged bending areas 52a, 52b whereat the flexible display 55 is conceived to be bent during a transition between a collapsed state 50a and an extended state 50b. The bonding area discussed with reference to FIG. 4 is preferably arranged at the region B and comprises the stiffener as, for example, is discussed with reference to FIG. 4. The electronic device 50 may further comprise the edge protector 53 arranged with rigid portions 53a and with flexible portions 54a, 54b, the latter corresponding to hinged areas 52a, 52b of the cover 52. In addition to the side protection also a back protection of the flexible display 55 may be provided.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below.

The invention claimed is:

1. An arrangement comprising:
    a flexible carrier having a front surface, a back surface and a lateral surface connecting between the front surface and the back surface;
    a component adhered to the front surface of the flexible carrier; and
    a stiffener comprising:
        a first region extending at least partially over said front surface or said back surface for protecting at least a portion of the front surface or the back surface of the flexible carrier; and
        a second region outside the first region and away from the lateral surface of the flexible carrier, wherein the second region is more flexible than the first region.

2. The arrangement according to claim 1, wherein the second region is arranged in a direct vicinity of the component.

3. The arrangement according to claim 1, wherein the second region is arranged substantially at an envisaged bending area of said stiffener.

4. The arrangement according to claim 1, wherein a thickness of the stiffener in the second region is smaller than a thickness of the stiffener in the first region.

5. The arrangement according to claim 1, wherein the second region comprises a gap or a blind gap.

6. The arrangement according to claim 1, wherein the stiffener comprises a stripe of material, the second region having a smaller dimension in a width or a length direction of said stripe than the first region.

7. The arrangement according to claim 1, wherein the second region comprises a different material than the first region.

8. The arrangement according to claim 1, wherein the arrangement comprises a portion of an electronic device, the component comprising an electronic component.

9. The arrangement according to claim 8, wherein the electronic component forms a part of a flexible display.

10. The electronic device according to claim 9, wherein the stiffener is arranged on the back surface of the flexible display.

11. The electronic device according to claim 9, wherein the stiffener is arranged at least partially on the front surface of the flexible display.

12. The electronic device according to claim 10, wherein the stiffener is shaped to accommodate at least one electronic component.

13. The electronic device according to claim 12, wherein the at least one electronic component is a part of a bonding area of the flexible display.

14. The electronic device according to claim 9, wherein the flexible display is conceived to be alternated between a collapsed state and an extended state.

* * * * *